United States Patent
Chang et al.

(10) Patent No.: US 8,624,394 B2
(45) Date of Patent: Jan. 7, 2014

(54) INTEGRATED TECHNOLOGY FOR PARTIAL AIR GAP LOW K DEPOSITION

(75) Inventors: Hung Jui Chang, Changhua County (TW); Chih-Tsung Lee, Hsinchu (TW); You-Hua Chou, Taipei (TW); Shiu-Ko Jang Jian, Tainan (TW); Ming-Shiou Kuo, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 63 days.

(21) Appl. No.: 13/313,542

(22) Filed: Dec. 7, 2011

(65) Prior Publication Data

US 2013/0147046 A1 Jun. 13, 2013

(51) Int. Cl.
*H01L 23/48* (2006.01)
(52) U.S. Cl.
USPC 257/751; 257/774; 257/E23.01; 257/E23.174
(58) Field of Classification Search
USPC .............. 257/751, 774, E23.01, E23.174
See application file for complete search history.

(56) References Cited

U.S. PATENT DOCUMENTS

| | | | |
|---|---|---|---|
| 6,841,844 B2 | 1/2005 | Hsu et al. | |
| 6,995,073 B2 | 2/2006 | Liou | |
| 7,393,776 B2 * | 7/2008 | Colburn et al. | 438/619 |
| 7,998,861 B2 * | 8/2011 | Lee et al. | 438/667 |
| 2004/0097065 A1 * | 5/2004 | Lur et al. | 438/619 |
| 2004/0214427 A1 * | 10/2004 | Kloster et al. | 438/637 |
| 2007/0218677 A1 * | 9/2007 | Engelhardt et al. | 438/618 |
| 2011/0076831 A1 * | 3/2011 | Chen | 438/421 |
| 2011/0140275 A1 * | 6/2011 | Noguchi et al. | 257/751 |
| 2011/0223739 A1 * | 9/2011 | Tu | 438/421 |
| 2011/0272810 A1 * | 11/2011 | Clevenger et al. | 257/741 |
| 2012/0104512 A1 * | 5/2012 | Horak et al. | 257/401 |

* cited by examiner

*Primary Examiner* — Mamadou Diallo
(74) *Attorney, Agent, or Firm* — Eschweiler & Associates, LLC

(57) ABSTRACT

A semiconductor device includes a semiconductor body and a low K dielectric layer overlying the semiconductor body. A first portion of the low K dielectric layer comprises a dielectric material, and a second portion of the low K dielectric layer comprise an air gap, wherein the first portion and the second portion are laterally disposed with respect to one another. A method for forming a low K dielectric layer is also disclosed and includes forming a dielectric layer over a semiconductor body, forming a plurality of air gaps laterally disposed from one another in the dielectric layer, and forming a capping layer over the dielectric layer and air gaps.

15 Claims, 8 Drawing Sheets

INTEGRATED TECHNOLOGY FOR PARTIAL AIR GAP LOW K DEPOSITION

BACKGROUND

In semiconductor manufacturing, a low K dielectric is a material with a small dielectric constant relative to silicon dioxide. Low K dielectric material implementation is one of several strategies used to allow continued scaling of microelectronic devices. In integrated circuits, insulating dielectrics separate the conducting parts (i.e., wire interconnects) from one another. As components have scaled and transistors have got closer together, the insulating dielectrics have thinned to the point where charge build up and crosstalk may, in some instance, adversely affect the performance of the device. Replacing the traditional silicon dioxide dielectric layers with a low K dielectric of the same thickness reduces parasitic capacitance, thus enabling faster switching speeds and lower heat dissipation.

DETAILED DESCRIPTION

Figure 1:
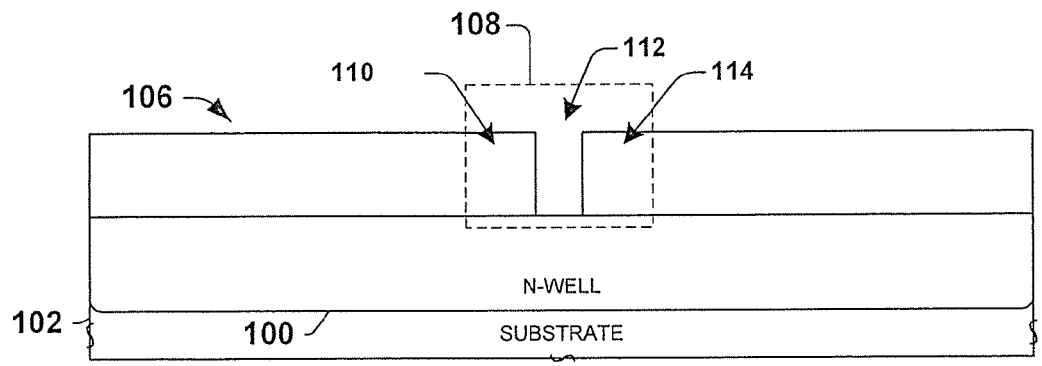
FIGS. 1 and 2 are fragmentary cross section diagram illustrating various features relating to a low dielectric constant structure according to one embodiment of the present disclosure.

One or more implementations of the present invention will now be described with reference to the attached drawings, wherein like reference numerals are used to refer to like elements throughout. The drawings are not necessarily drawn to scale.

Traditional dielectric layers such as silicon dioxide have a relatively high dielectric constant of about 3.9, while some other materials such as fluorine silicon oxide have a dielectric constant of about 3.7. A class of materials typically referred to as low K dielectric materials have a dielectric constant of about 3.0 or lower, while a dielectric constant of 2.0 or less is deemed to an ultra low K dielectric material. Air, on the other hand, as a dielectric constant of 1.0. Strategies to use various low K dielectric materials suffer from poor mechanical properties, poor adhesion, difficult integration, and poor defect control. The present disclosure employs air gaps in more traditional dielectric layers to reduce the effective dielectric constant of the dielectric layer.

FIG. 1 is a fragmentary cross section diagram illustrating a semiconductor device according to one embodiment. The device includes a semiconductor body 100 such as a substrate or a doped well region in a substrate, such as the n-well formed in a lightly doped p-type substrate 102. Any type of semiconductor body, such as a starting material, doped starting material, epitaxial layers formed on or over a substrate, etc. may constitute a semiconductor body, and all such variations are contemplated as falling within the scope of the present disclosure. Generally speaking, a low K dielectric layer 106 overlies the semiconductor body 102, wherein the low K dielectric layer 106, in one region 108 comprises a first portion 110, a second portion 112, and a third portion 114. In one embodiment, the first portion 110 and the third portion 114 comprise a dielectric material, while the second portion 112 comprises an air gap. While FIG. 1 illustrates solely one region 108 having first, second and third regions 110, 112, 114, many such regions such as region 1078 may be reproduced through the low K dielectric layer 106.

Figure 2:
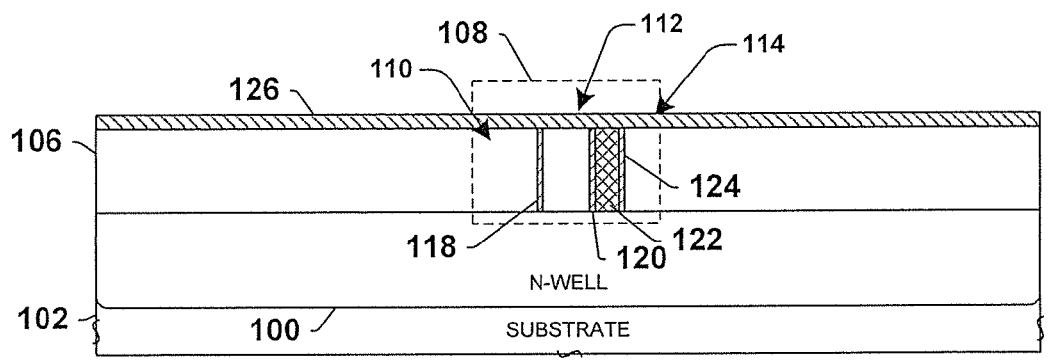

The air gap 112 in the low K dielectric layer 106 serves to lower the effective dielectric constant of the layer as a whole. By forming many air gaps 112 with dielectric lateral 110, 114 on opposing sides, the structural stability of the low K dielectric layer 106 is maintained. IN addition, in one embodiment illustrated in FIG. 2, moisture barrier layers 118 and 120 that extend vertically on opposing sides of the air gap 112 may be formed to provide a moisture barrier that protects the dielectric material in first and third portions 110, 112 from contamination and/or degradation due to any moisture that may reside within the air gap 112. In addition, as illustrated in FIG. 2, a conductive material 122 such as copper may reside near the air gap 112, disposed laterally next to the second moisture barrier layer 120. The conductive material 122 may, in one embodiment, be formed concurrently with other conductive metallization, or alternatively in a separate processing step. In one embodiment the conductive layer 122 is copper and the moisture barrier layer 120 also serves as a copper diffusion barrier. In one embodiment the moisture barrier layers comprise a silicon nitride, however, any material that provides a moisture barrier and preclude diffusion may be employed and such materials are contemplated as falling within the second of the present disclosure.

In an embodiment where the conductive layer 122 comprises copper, a diffusion barrier layer 124 also resides on an opposing side thereof to prevent out-diffusion into the dielectric material. Again, while FIGS. 1 and 2 illustrate solely one air gap 112 in the dielectric layer, the number of air gaps can be multiplied to include a very large number of air gaps, thereby reducing the effective dielectric constant of the low K dielectric layer 106 while concurrently maintaining a structural stability of the layer. Further, as illustrated in FIG. 2, after the air gaps 112 are formed in the dielectric layer 106, a capping layer 126, such as an etch stop layer, may be formed thereover.

Figure 3:
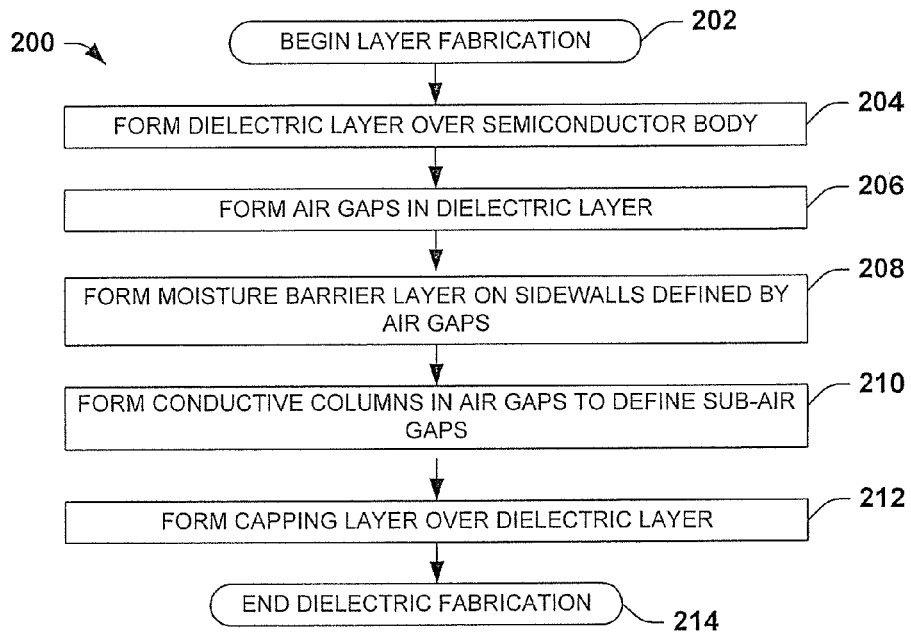
FIG. 3 is a flow chart diagram illustrating a method of forming a low dielectric constant layer according to an embodiment of the present disclosure.
Figure 4:
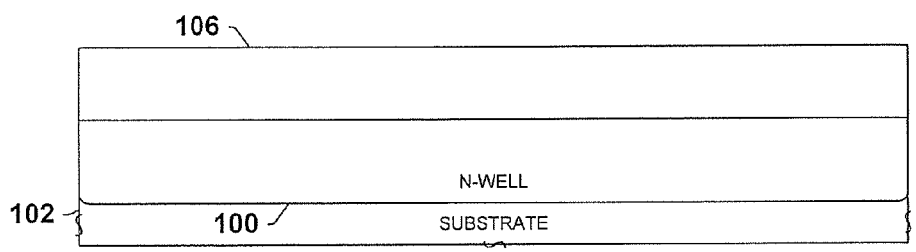
FIGS. 4-8 are fragmentary cross section diagrams illustrating various steps in the formation of a low dielectric constant layer according to the method of FIG. 3.

Turning now to FIG. 3, FIG. 3 is a flow chart diagram illustrating various acts in a method 200 that may be employed to fabricate a low K dielectric layer, such as layer 106 of FIGS. 1 and 2. While the method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present disclosure. Furthermore, the methods according to this disclosure may be implemented in association with the fabrication of ICs including both active and passive devices.

The method 200 begins at 202 and proceeds to 204, wherein a well may be formed in a substrate to form a semiconductor body. Alternatively, the semiconductor body may comprise the substrate itself or an epitaxial layer grown over the substrate. Any form of semiconductor body may be employed and is contemplated as falling within the scope of the present disclosure.

Figure 5:
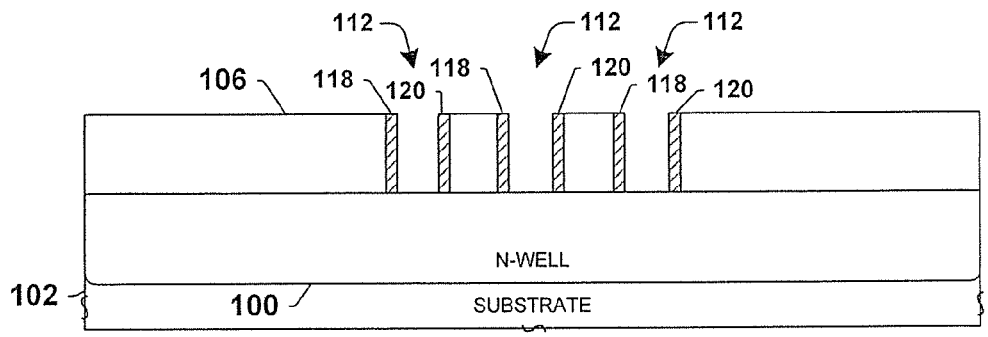
Figure 6:
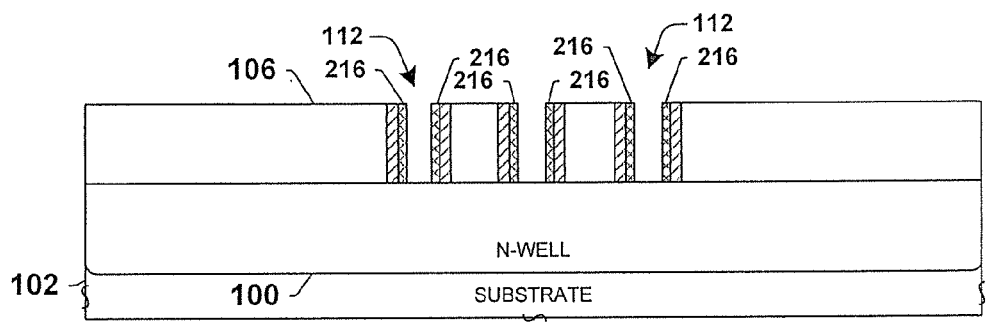

Returning to FIG. 3, one or more air gaps 112 are formed in the dielectric layer 106 at 206. In one embodiment, the air gaps 112 are formed by etching, for example, using a patterned photoresist as a mask and then removing the photoresist by, for example, ashing. A moisture barrier layer is then formed in the air gasps at 208 of FIG. 3 in a substantially conformal deposition process, followed by an anisotropic etch to remove the moisture barrier material on lateral surfaces, leaving vertically extending moisture barriers 118, 120 on opposing sides of the air gaps 112, as illustrated in FIG. 5. The deposition technique, in one embodiment, may comprise atomic layer deposition (ALD) and the anisotropic etch may comprise a reactive ion etch (RIE), however, other conformal depositions and anisotropic etches may be employed and are contemplated as falling within the scope of the present disclosure.

Figure 7:
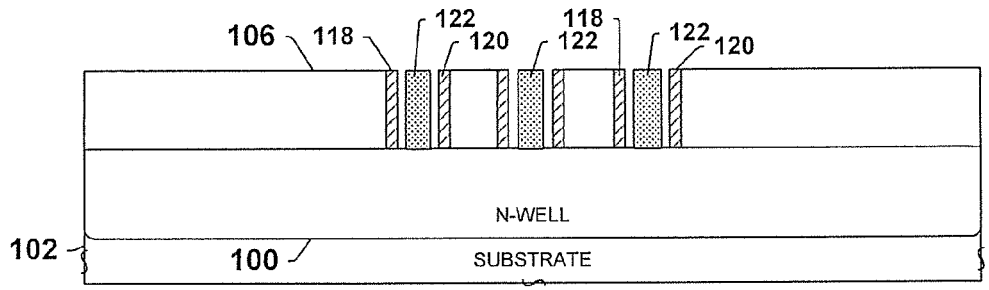
Figure 8:
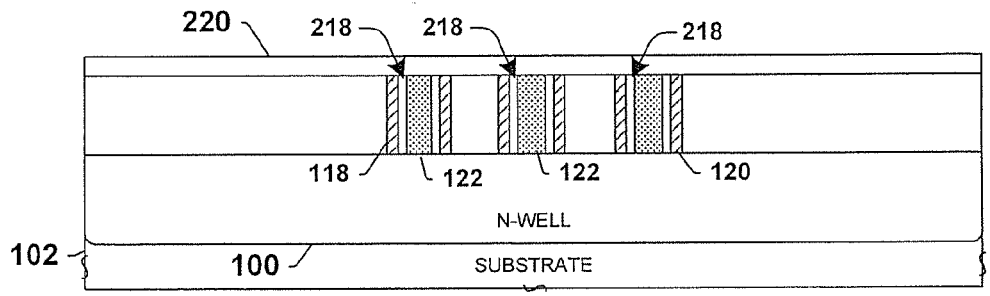

Still referring to FIG. 3, the method 200 comprise forming conductive columns in the air gaps 112 to define sub-air gaps at 210. In one embodiment, act 210 may be performed by first depositing a sacrificial layer on lateral sides of the moisture barriers 118, 120 and then performing an anisotropic etch to form vertically extending sacrificial regions 216 next to the moisture barriers 118, 120. Subsequently a conductive layer is formed to fill the remaining air gaps 112 and planarized, for example, via chemical mechanical polishing (CMP) to form a planar surface exposing top edges of the dielectric layer 106, moisture barriers 118, 120, sacrificial regions 216 and conductive columns 122. Act 210 the concludes with an etch of the exposed sacrificial regions 216 to remove them, thus defining sub-air gaps 218 on opposing sides of the conductive columns 122, as illustrated in FIG. 7. In one embodiment the sacrificial region 216 is an oxide, however, other materials having sufficient selectivities with respect of the dielectric layer 10-6, moisture barriers 118, 120 and conductive columns 122 may be employed, and all such materials are contemplated as falling within the scope of the present disclosure. In addition, the etch utilized to remove the sacrificial regions 216 may be a wet etchant, although a dry etch may having sufficient selectivity may also be employed. Further, in one embodiment the conductive column or pillar 122 is composed of copper, but other materials, either conductive, semi-conductive, or insulative may be employed.

Lastly, method 200 comprises forming a capping layer 220 over the underlying structure to cover the sub-air gaps. In one embodiment the capping layer 220 comprises an etch stop layer, but any layer may be employed and is contemplated as falling within the scope of the present disclosure. In one embodiment, the capping layer 220 may be formed by a chemical vapor deposition (CVD) or other film forming process.

Figure 9:
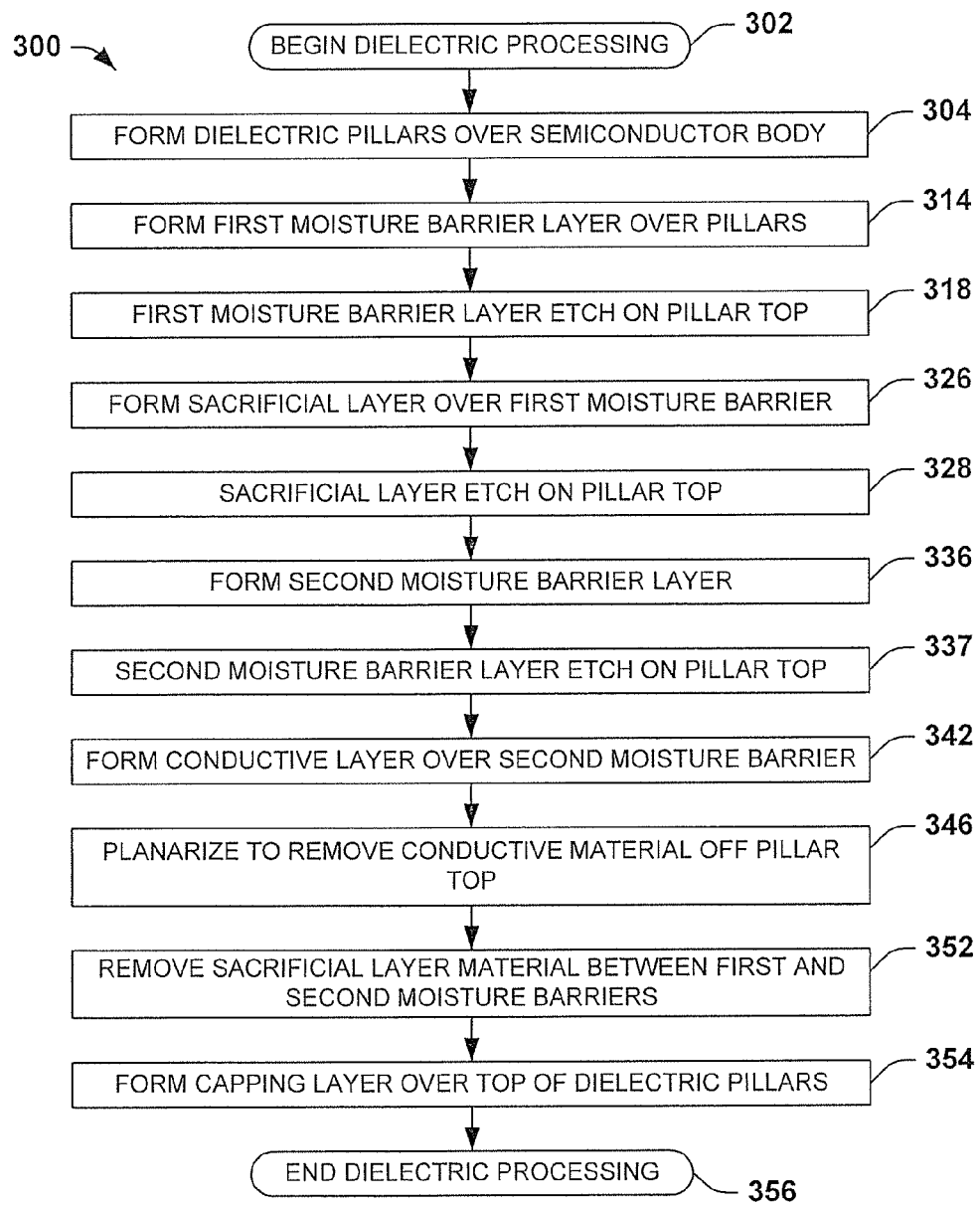
FIG. 9 is a flow chart diagram illustrating a method of forming a low dielectric constant layer according to another embodiment of the present disclosure.
Figure 10:
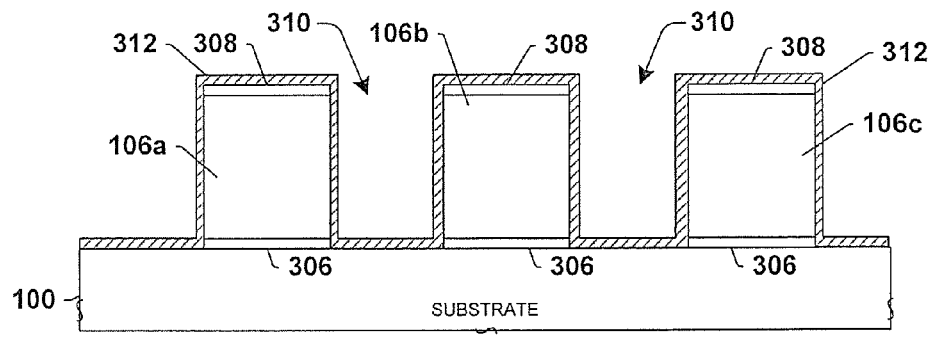
FIGS. 10-20 are fragmentary cross section diagrams illustrating various steps in the formation of a low dielectric constant layer according to the method of FIG. 9.

Another method 300 of forming a low K dielectric layer 106 is illustrated in the flow chart of FIG. 9 and the fragmentary cross section diagrams of FIGS. 10-20. The method 300 begins at 300 with an initiation of dielectric processing at 302, wherein a dielectric layer 106 is formed over a semiconductor body 100. In one embodiment the dielectric layer 106 is formed by chemical vapor deposition (CVD), however, any manner of forming the layer may be employed and all such variations are contemplated as falling within the scope of the present disclosure. In one embodiment illustrated in FIG. 10, the dielectric layer 106 is formed directly over a starting material substrate as the semiconductor body, however, doped regions or epitaxially formed regions may comprise such semiconductor body. In addition, while FIG. 10 illustrates the dielectric layer 106 directly over the semiconductor body 100, it should be understood that one or more intervening layers may reside therebetween.

The method 300 proceeds by forming dielectric pillars by patterning the deposited dielectric layer 106 at 304 of FIG. 9, wherein such pillars are identified in FIG. 10 with the reference numerals 106a, 106b, and 106c, respectively. While FIG. 10 illustrates three pillars, it should be understood that the number of formed pillars may vary and all such variations are contemplated by the present disclosure. In one embodiment, the pillars 106a are a multi-layer composed of an underlying etch stop layer 306 (ESL), the dielectric material 106, and an overlying hardmask layer 308 (HM). These layers are deposited consecutively at 302 and may be deposited by chemical vapor deposition, for example. In one example, the etch stop layer 306 may be silicon nitride (SiN), silicon oxynitride (SiON), silicon carbinde (SiC), oxygen doped silicon carbide (SiOC), and nitride doped silicon carbide (SiCN). In one example, the hard mask layer 308 may be silicon oxynitride (SiON), or oxygen doped silicon carbide (SiOC). Upon patterning of the multi-layer dielectric to form the pillars 106a, 106b and 106c, spaces 310 are defined between the respective pillars.

III referring to FIGS. 9 and 10, the method 300 comprises forming a moisture barrier layer 312 over the pillars 106a, 106b and 106c, at 314. The moisture barrier layer 312 is formed via a conformal deposition process such as atomic layer deposition (ALD) in order to conformally adhere along sidewalls 316 of the pillars. In one embodiment the moisture barrier layer comprises silicon nitride that can also operate as a diffusion barrier, as will be appreciated in further processing. Any moisture barrier material (for example, ALD silicon nitride (SiN) or carbon silicon nitride (SiCN) may be used and all such materials are contemplated as falling within the scope of the present invention.

Figure 11:
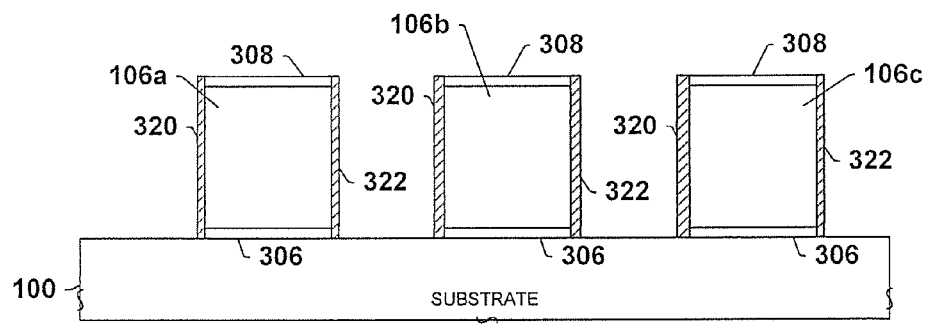

The moisture barrier layer 312 is patterned to remove portions thereof at 318 that reside on lateral surfaces such as top portions of the pillars 106a, 106b and 106c and regions in the spaces 310 between the pillars. This patterning leaves vertically extending moisture barriers 320, 322 on opposing sides of the pillars, as illustrated in FIG. 11. In one embodiment the moisture barrier layer is patterned using an anisotropic etch such as a reactive ion etch (RIE) that is substantially selective with respect to the hardmask 308 and the semiconductor body 100.

Figure 12:
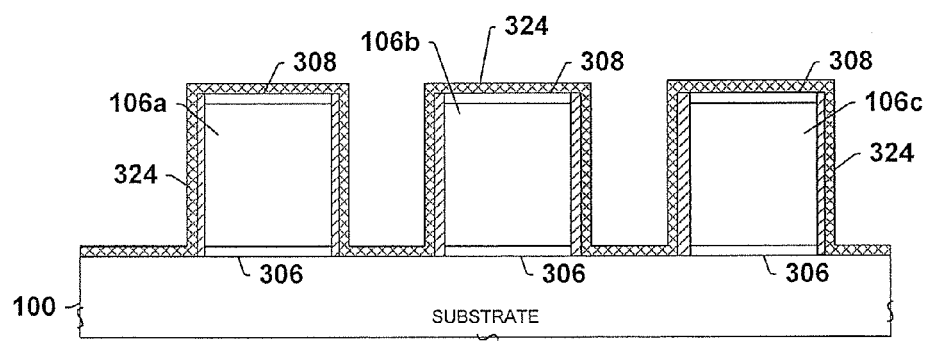
Figure 13:
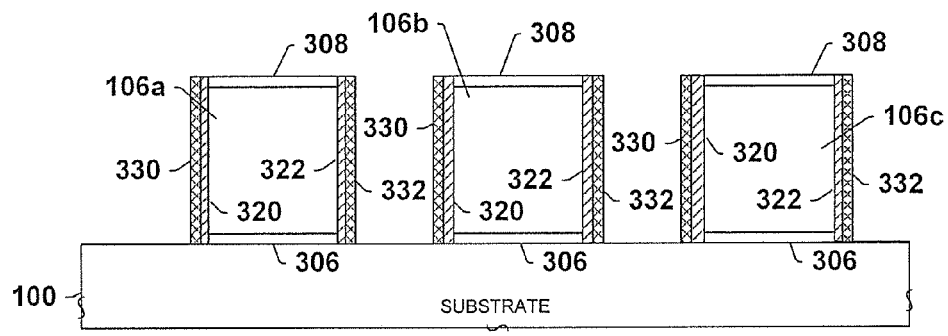

Returning to FIG. 9, a sacrificial layer 324 is formed over the pillars 106a, 106b and 106c at 326 in a conformal deposition process such as ASD, as illustrated in FIG. 12. In one embodiment the sacrificial layer 324 is an oxide, however, other materials may be employed that serve the same function, as will be more fully appreciated later. For example, such materials include ALD silicon dioxide (SiO2), ALD SiO2 is advantageous due to a large etch selectivity with a SiN or SiCN barrier film. A sacrificial layer etch is then performed at 328 of FIG. 9 to remove portions of the sacrificial layer 324 that reside on lateral surfaces such as over the hardmask 308 portions of the pillars 106a, 106b and 106c an din the spaces 310 between the pillars. Again, such an etch may be an anisotropic etch that results in vertically extending sacrificial regions 330 and 332 on opposing sides of the pillars 106a, 106b and 106c, and disposed next to the respective moisture barriers 320 and 322, as illustrated in FIG. 13.

Figure 14:
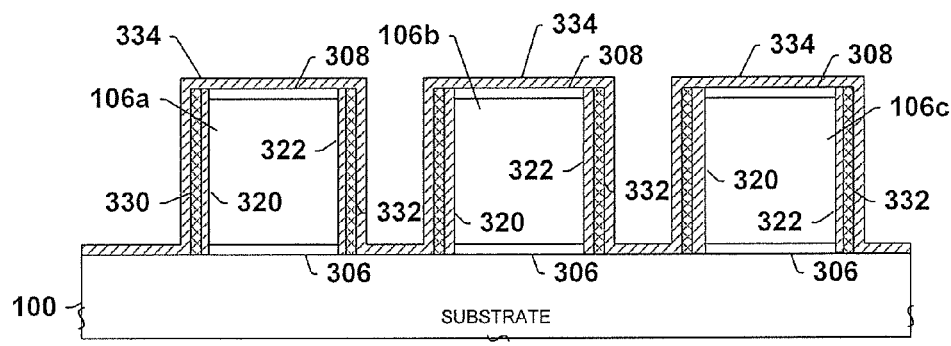
Figure 15:
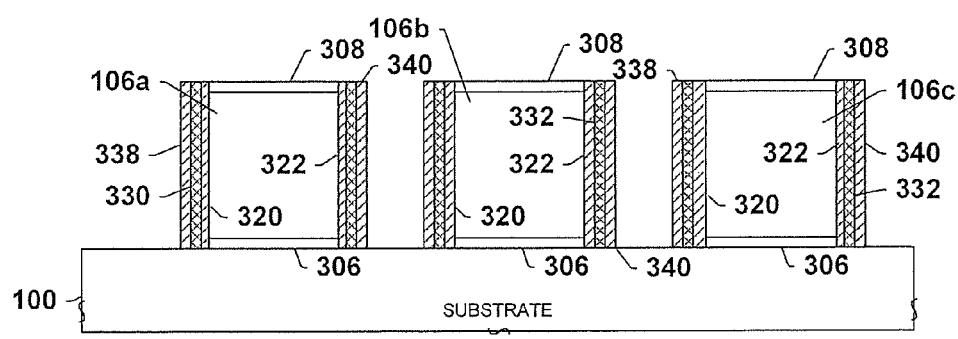

Referring again to FIG. 9, a second moisture barrier layer 334 is formed over the pillars 106a, 106b and 106c at 336, as illustrated in FIG. 14. The second moisture barrier layer 334 is then patterned to remove lateral portions on top of the pillars 106a, 106b and 106c and in the spaces 310, as illustrated in FIG. 15. As illustrated in FIG. 15 the patterning of the second moisture barrier layer 334 at 337 of FIG. 9 results in a second pair of vertically extending moisture barriers 338 and 340 on opposing sides, wherein the first and second moisture barriers 322 and 340, and 320 and 338 effectively sandwich the sacrificial regions 332 and 330, respectively, as shown in FIG. 15.

Figure 16:
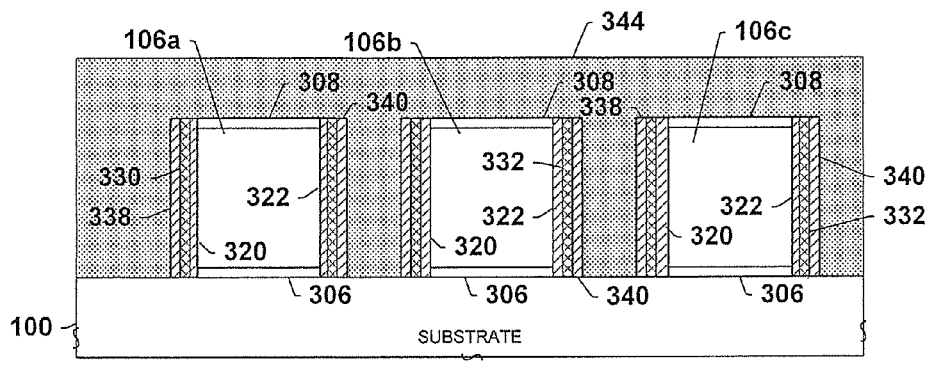

At 342 of FIG. 9 the method 300 continues with formation of a conductive layer 344 over and between the pillars 106a, 106b and 106c, thereby filling in the spaces 310 between the pillars, as illustrated in FIG. 16. In one example, before the conductive layer 344 is formed, if formed with copper, a copper barrier layer is formed, such as a titanium nitride (TiN) or tantalum nitride (TaN) layer. In one example, the copper barrier layer is formed via physical vapor deposition. In one embodiment the conductive layer 344 comprises copper and is formed by depositing a copper seed layer followed by an electroplating process. Alternatively the conductive layer is formed by other materials such as aluminum. Any conductive material may be employed and is contemplated as falling within the scope of the present disclosure. In one alternative example, Graphene is employed. In one embodiment the formation of the copper layer is deposited concurrently with the formation of the metallization for devices on the integrated circuit chip.

Figure 17:
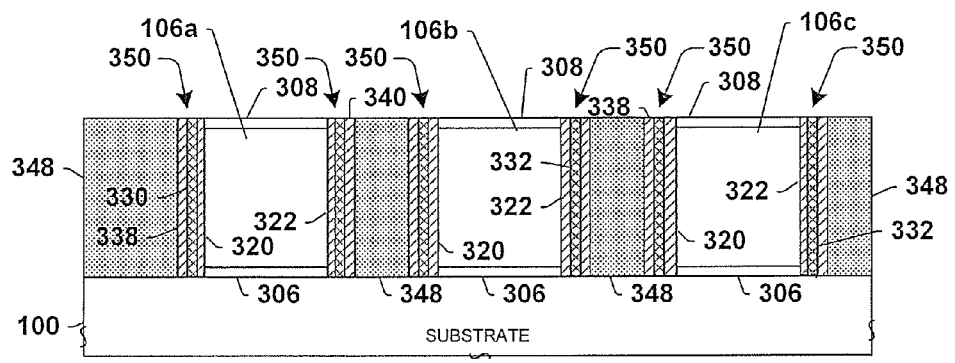
Figure 18:
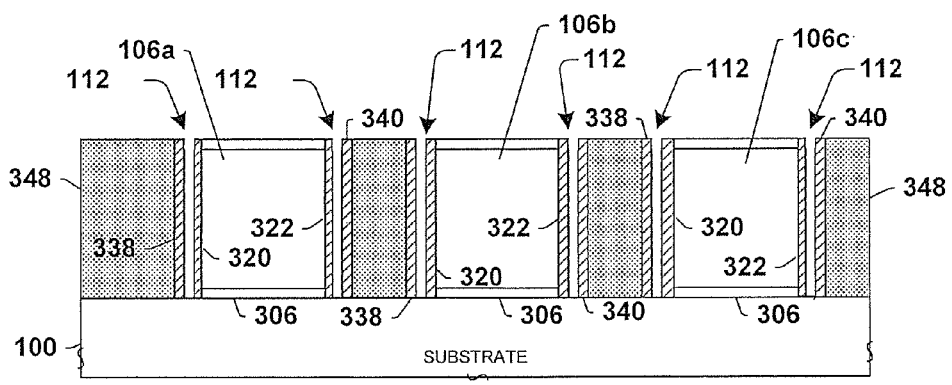

The conductive layer is then planarized at 346 of FIG. 9, resulting in removal of conductive material on top portion of the pillars 106a, 106b and 106c (i.e., exposing the hardmask portions 308), and leaving conductive material between the second moisture barriers 338 and 340 to form conductive columns 348, as illustrated in FIG. 17. In one embodiment the planarization at 346 is performed via CMP, however, any planarization may be performed and is contemplated as falling within the scope of the present disclosure. As seen in FIG. 17, the planarization of the conductive layer 344 results into portions 350 of the moisture barriers 320, 322, 338 and 340 and sacrificial portions 330 and 332 being exposed. Due to this exposure, the sacrificial layer material 330 and 332 are removed at 352 in FIG. 9, as illustrated in FIG. 18, thereby defining air gaps 112 that are bounded by the first and second moisture barriers 320, 322, 338 and 340.

Figure 19:
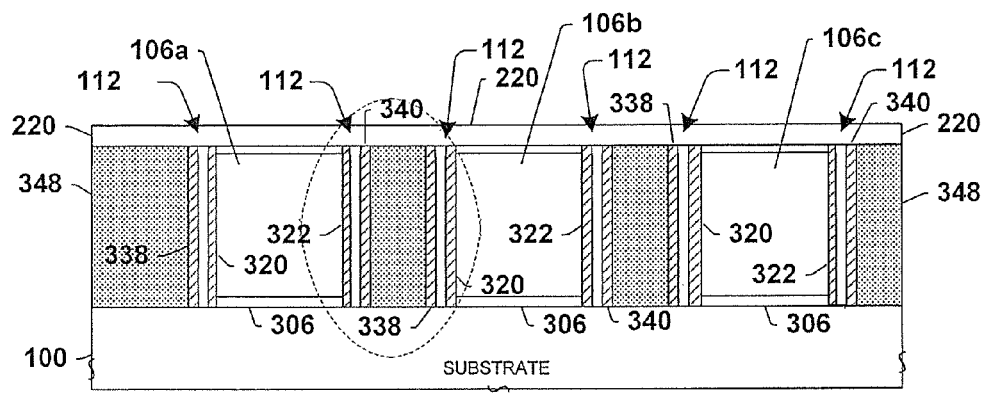

At 354 in FIG. 9 a capping layer 220 is formed over the dielectric pillars 106a, 106b and 106c, and air gaps 112, thereby covering the air gaps, as illustrated in FIG. 19. The method 300 then discontinues at 356, however, additional dielectric processing on other backend processing may continue, as may be appreciated.

Figure 20:
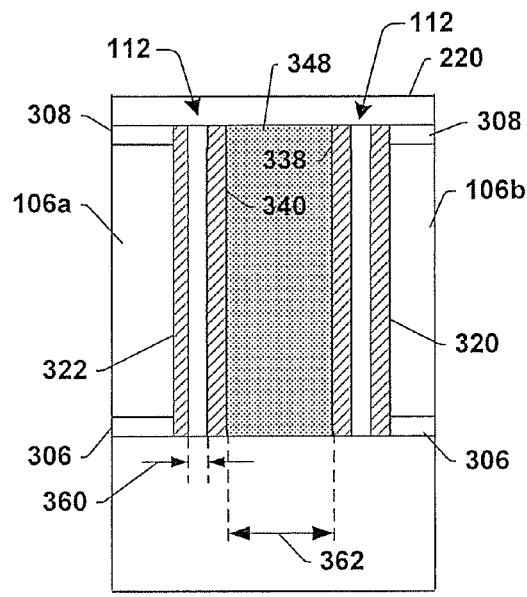

Referring to FIG. 19, a portion 360 of the figure is enlarged to facilitate a more detailed illustration of various feature in FIG. 20. As can be seen, between the two dielectric pillars 106a and 106b resides two pairs of moisture barriers 322, 340 and 320, 338 that surround air gaps 112 on opposing sides of a conductive column 348. The moisture barriers 322, 340 and 320, 338 operate to prevent moisture from moving from the air gaps into the dielectric material 106a, 106b that may otherwise adversely affect device performance and/or reliability. Further, as shown in FIG. 20, the air gaps 112 have a width 360 that corresponds to a thickness of the sacrificial layer 324 that was formed in FIG. 12. By making the sacrificial layer 324 more thick, the thickness 360 of the air gaps 112 may be increased. Likewise, by decreasing the thickness of the sacrificial layer 324 the thickness of the air gap may be decreased. In such a manner the effective dielectric constant of the dielectric layer 106 may be tuned or otherwise varied as desired. As may be appreciated the larger the air gaps become, the more the effective dielectric constant of the layer is reduced.

Similarly, still referring to FIG. 20, a width 362 of the conductive pillar or column 348 may be varied by altering the pitch of the dielectric pillars 106a, 106b and 106c, wherein the spacings 310 of FIG. 10 are varied. Likewise, the width of the dielectric pillars 106a, 106b and 106c may be varied, thus also modulating the pitch defined by the widths of the pillars and respective spacings 310. In the above fashion the density of the air gaps 12 within the dielectric layer 106 may be varied to provide another degree of freedom in varying the effective dielectric constant of the layer 106.

While it may be desirable to vary a width 360 of the air gaps 112 and a width 362 of the conductive columns 348 to any a degree, some practical considerations need to be considered. That is, the air gap width 360 cannot be so large that the subsequent formation of the capping layer 220 fills the air gap 112. Similarly, the width of the conductive column 348 cannot be so narrow that the spacings 310 are too small to have the copper or other conductive material properly form therein.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A semiconductor device, comprising:
   a substrate; and
   a low K dielectric layer over the substrate, wherein a first portion of the low K dielectric layer comprises a dielectric material, a second portion of the low K dielectric layer comprises an air gap, wherein the first portion and the second portion are laterally disposed with respect to one another, and a third portion, wherein the first portion and third portion are laterally disposed on opposing sides of the second portion,
   wherein the first portion comprises:
      a vertically extending first moisture barrier adjacent the second portion; and
      the dielectric material adjacent the first moisture barrier opposite the second portion.

2. The semiconductor device of claim 1, wherein the dielectric material of the first portion is not a low K dielectric material.

3. The semiconductor device of claim 2, wherein the dielectric material comprises one of silicon nitride, silicon oxynitride, silicon carbide, oxygen doped silicon carbide, and nitrogen doped silicon carbide.

4. The semiconductor device of claim 1, wherein the third portion comprises:
   a vertically extending second moisture barrier adjacent the second portion; and
   a conductive material adjacent the second moisture barrier opposite the second portion.

5. The semiconductor device of claim 4, wherein the conductive material comprises copper, and wherein the vertically extending first and second moisture barriers comprise a copper diffusion barrier material.

6. A semiconductor device, comprising:
   a substrate; and
   a low K dielectric layer over the substrate, wherein a first portion of the low K dielectric layer comprises a dielectric material, a second portion of the low K dielectric layer comprises an air gap, wherein the first portion and the second portion are laterally disposed with respect to one another, and a third portion, wherein the first portion and third portion are laterally disposed on opposing sides of the second portion,
   wherein the first portion and the third portion of the low K dielectric layer comprises:
      an etch stop layer overlying the semiconductor body;
      a dielectric material overlying the etch stop layer, wherein the dielectric material is not a low K material; and
      a hardmask material overlying the dielectric material.

7. A semiconductor device, comprising:
   a substrate; and
   a low K dielectric layer over the substrate, the low K dielectric layer comprising a dielectric layer having a plurality of air gap regions therein, wherein the plurality of air gap regions are laterally disposed from one another, and wherein the dielectric layer is not a low K dielectric material, and
   wherein each of the plurality of air gaps comprise a conductive pillar disposed in the air gap, thereby defining a first sub-air gap and a second sub-air gap on opposing sides thereof.

8. The semiconductor device of claim 7, wherein the dielectric layer comprises one of silicon nitride, silicon oxynitride, silicon carbide, oxygen doped silicon carbide, and nitrogen doped silicon carbide.

9. The semiconductor device of claim 7, wherein each air gap has first and second opposing sides defined by the dielectric layer, further comprising first and second vertical moisture barriers disposed on the first and second opposing sides of the air gap, respectively, and abutting the dielectric layer.

10. The semiconductor device of claim 9, wherein the first sub-air gap is defined by the first moisture barrier and a first side of the conductive pillar, and the second sub-air gap is defined by the second moisture barrier and a second, opposing side of the conductive layer.

11. A semiconductor device, comprising:
   a substrate; and
   a low K dielectric layer comprised of a non-low K dielectric material having a plurality of air gaps laterally disposed therein,
   wherein at least one of the air gaps comprises a first vertical wall and a second, laterally disposed vertical wall, wherein the first vertical wall is a first wall portion of the non-low K dielectric material, and wherein the second vertical wall is a first sidewall of a pillar structure in the at least one of the air gaps.

12. The semiconductor device of claim 11, wherein the pillar structure comprises a conductive pillar, and further comprising:
   a vertical moisture barrier layer disposed against the first wall portion of the non-low K dielectric material; and
   a vertical diffusion barrier layer disposed against the first sidewall of the conductive pillar,
   thereby defining the at least one of the air gaps between the vertical moisture barrier layer and the vertical diffusion barrier layer.

13. The semiconductor device of claim 12, wherein the conductive pillar comprises copper and the vertical diffusion barrier layer comprises a copper diffusion barrier material.

14. A semiconductor device, comprising:
   a substrate; and
   a low K dielectric layer comprised of a non-low K dielectric material having a plurality of air gaps laterally disposed therein,
   wherein at least one of the air gaps is defined by first and second opposing sidewalls of the non-low K dielectric material and comprises:
      a first sub-air gap and a second sub-air gap separated by a conductive pillar;
      wherein the first sub-air gap is defined on one side by the first sidewall of the non-low K dielectric material and on another side by a first sidewall of the conductive pillar, and
      wherein the second sub-air gap is defined by the second sidewall of the non-low K dielectric material and on another side by a second sidewall of the conductive pillar.

15. The semiconductor device of claim 14, further comprising:
   a first vertical moisture barrier layer in the first sub-air gap disposed against the first sidewall of the non-low K dielectric material;
   a second vertical moisture barrier layer in the second sub-air gap disposed against the second sidewall of the non-low K dielectric material;
   a first vertical diffusion barrier layer in the first sub-air gap disposed against the first sidewall of the conductive pillar;
   a second vertical diffusion barrier layer in the second sub-air gap disposed against the second sidewall of the conductive pillar,
   wherein the first sub-air gap is defined by a space between the first vertical moisture barrier and the first vertical diffusion barrier layer, and
   wherein the second sub-air gap is defined by a space between the second vertical moisture barrier and the second vertical diffusion barrier layer.

* * * * *